United States Patent
Hunger et al.

(10) Patent No.: US 9,651,979 B2
(45) Date of Patent: May 16, 2017

(54) CIRCUIT CARRIER, METHOD FOR PRODUCING A CIRCUIT CARRIER, METHOD FOR PRODUCING A CIRCUIT ARRANGEMENT, METHOD FOR OPERATING A CIRCUIT ARRANGEMENT AND METHOD FOR PRODUCING A SEMICONDUCTOR MODULE

(71) Applicant: Infineon Technologies AG, Neubiberg (DE)

(72) Inventors: Thomas Hunger, Moehnesee (DE); Carsten Ehlers, Moenchengladbach (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 14/925,394

(22) Filed: Oct. 28, 2015

(65) Prior Publication Data
US 2016/0132069 A1 May 12, 2016

(30) Foreign Application Priority Data

Oct. 30, 2014 (DE) .......................... 10 2014 115815

(51) Int. Cl.
*H01L 21/00* (2006.01)
*G05F 3/02* (2006.01)
(Continued)

(52) U.S. Cl.
CPC .............. *G05F 3/02* (2013.01); *B23K 1/0016* (2013.01); *H01L 21/4857* (2013.01); *H01L 21/54* (2013.01); *H01L 23/053* (2013.01); *H01L 23/15* (2013.01); *H01L 23/49822* (2013.01); *H01L 24/27* (2013.01); *H01L 25/065* (2013.01); *H01L 23/3735* (2013.01); *H01L 2224/32225* (2013.01);
(Continued)

(58) Field of Classification Search
None
See application file for complete search history.

(56) References Cited

U.S. PATENT DOCUMENTS 6,984,895 B2 * 1/2006 Cho ...................... H01L 23/585
257/781
2005/0150683 A1 7/2005 Farnworth et al.
(Continued)

FOREIGN PATENT DOCUMENTS

| DE | 10130517 A1 | 1/2003 |
|---|---|---|
| EP | 0921565 A2 | 6/1999 |
| EP | 2302676 A1 | 3/2011 |

*Primary Examiner* — Lincoln Donovan
*Assistant Examiner* — Khareem E Almo
(74) *Attorney, Agent, or Firm* — Murphy, Bilak & Homiller, PLLC

(57) ABSTRACT

A circuit carrier includes a dielectric isolation carrier, an upper metallization layer applied to the dielectric isolation carrier, and a dielectric coating. The upper metallization layer has a metallization section which has an underside facing the isolation carrier, a top side facing away from the isolation carrier, and a side surface closed in a ring-shaped fashion. The side surface laterally delimits the metallization section and extends continuously between the top side and the underside. The dielectric coating is on the side surface and the top side, and extends continuously from the side surface onto the top side.

20 Claims, 10 Drawing Sheets

(51) Int. Cl.
*H01L 21/48* (2006.01)
*H01L 21/54* (2006.01)
*H01L 23/498* (2006.01)
*B23K 1/00* (2006.01)
*H01L 23/053* (2006.01)
*H01L 23/15* (2006.01)
*H01L 25/065* (2006.01)
*H01L 23/00* (2006.01)
*H01L 23/373* (2006.01)

(52) U.S. Cl.
CPC .............. *H01L 2224/48091* (2013.01); *H01L 2224/48472* (2013.01); *H01L 2224/73265* (2013.01); *H01L 2224/83101* (2013.01); *H01L 2224/83192* (2013.01); *H01L 2224/92247* (2013.01); *H01L 2924/181* (2013.01); *H01L 2924/19107* (2013.01)

(56) References Cited

U.S. PATENT DOCUMENTS

| | | | |
|---|---|---|---|
| 2006/0035459 A1* | 2/2006 | Lingunis | G03F 1/36 438/637 |
| 2007/0243404 A1 | 10/2007 | Lin | |
| 2012/0094418 A1* | 4/2012 | Grama | H01L 23/315 438/51 |
| 2015/0339565 A1* | 11/2015 | Pueschner | H01L 23/49855 235/488 |
| 2016/0197111 A1* | 7/2016 | Coolbaugh | H01L 27/14625 257/432 |

* cited by examiner

CIRCUIT CARRIER, METHOD FOR PRODUCING A CIRCUIT CARRIER, METHOD FOR PRODUCING A CIRCUIT ARRANGEMENT, METHOD FOR OPERATING A CIRCUIT ARRANGEMENT AND METHOD FOR PRODUCING A SEMICONDUCTOR MODULE

PRIORITY CLAIM

This application claims priority to German Patent Application No. 10 2014 115 815.6 filed on 30 Oct. 2014, the content of said application incorporated herein by reference in its entirety.

TECHNICAL FIELD

The present invention relates to a circuit carrier, to a method for producing a circuit carrier, to a method for producing a circuit arrangement, and to a method for operating a circuit arrangement, and to a method for producing a semiconductor module.

BACKGROUND

Electrical circuit arrangements are often realized with the aid of circuit carriers, during the operation of which circuit arrangements the circuit carriers are subjected to high electrical voltages. Undesired voltage flashovers or partial discharges can occur in this case.

SUMMARY

A circuit carrier and a method for producing a circuit carrier having a high strength in relation to voltage flashovers and high partial discharge strength are provided. A method for producing a circuit arrangement having high strength in relation to voltage flashovers and high partial discharge strength is also provided. A method for operating a circuit arrangement during which at most slight partial discharges occur is furthermore provided.

According to an embodiment of a circuit carrier, the circuit carrier comprises a dielectric isolation carrier and an upper metallization layer applied to the dielectric isolation carrier and having a metallization section. The metallization section has an underside facing the isolation carrier, a top side facing away from the isolation carrier, and a side surface closed in a ring-shaped fashion. The side surface laterally delimits the metallization section and extends continuously between the top side and the underside. The circuit carrier also comprises a dielectric coating which bears on the side surface and the top side and extends continuously from the side surface onto the top side.

According to an embodiment of a method for producing a circuit carrier, the method comprises providing a dielectric isolation carrier to which an upper metallization layer is applied, the metallization layer having a metallization section. The metallization section has an underside facing the isolation carrier, a top side facing away from the isolation carrier, and a side surface closed in a ring-shaped fashion. The side surface laterally delimits the metallization section and extends continuously between the top side and the underside. Furthermore, a dielectric coating is produced, which bears on the side surface and the top side and extends continuously from the side surface onto the top side.

According to an embodiment of a semiconductor arrangement, the semiconductor arrangement comprises a circuit carrier as described above. For this purpose, a semiconductor component having a first electrode and a second electrode is provided. The continuous section is fitted with the semiconductor component by the semiconductor component being cohesively connected to the continuous section at the second electrode by means of a connecting layer.

According to an embodiment of operating a semiconductor arrangement as described above, an electrical voltage of at least 10 V is applied between the first electrode and the second electrode.

According to an embodiment of a method for producing a semiconductor module, a semiconductor arrangement as described above is produced. Moreover, a module housing is provided. The semiconductor arrangement is connected to the module housing. Afterward, a dielectric potting compound, which optionally has a smaller relative permittivity and/or a smaller breakdown field strength than the dielectric coating, is filled into to module housing in such a way that the dielectric potting compound contacts the dielectric coating.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
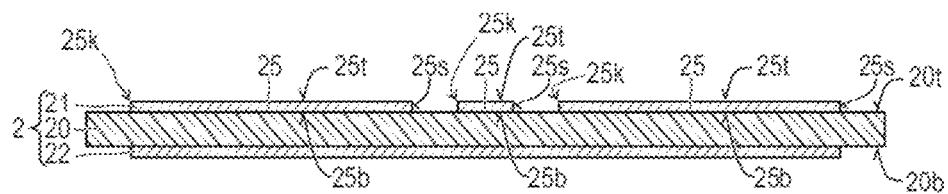
FIG. 1 shows a cross section through a circuit carrier.
Figure 2:
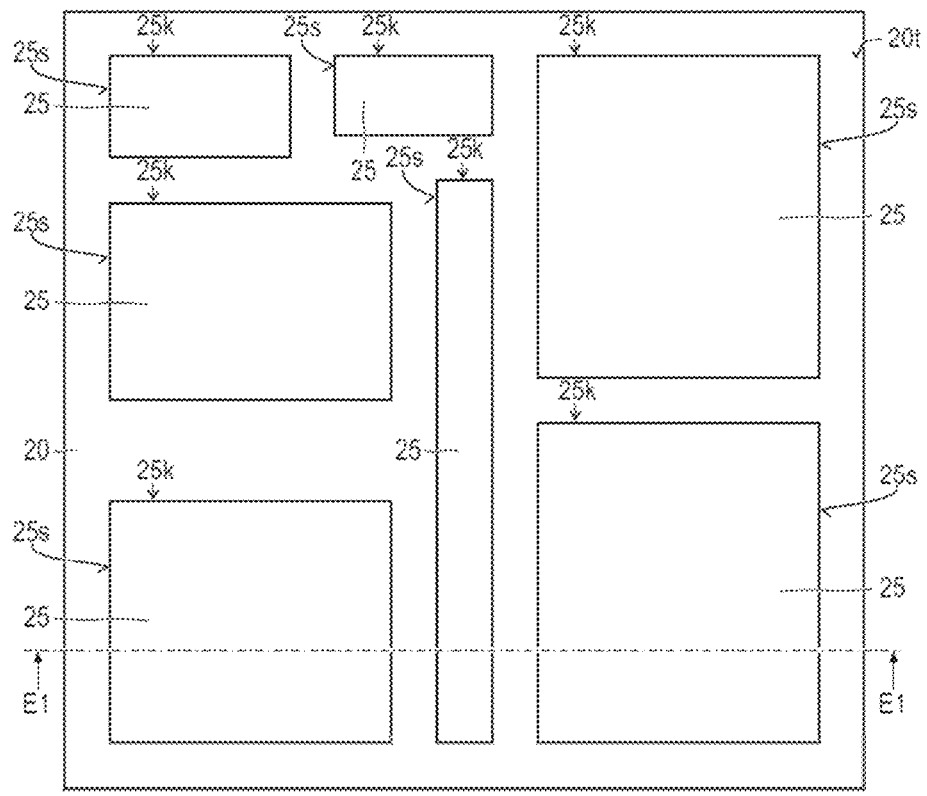
FIG. 2 shows a plan view of the circuit carrier in accordance with FIG. 1.

FIG. 1 shows a cross section through a circuit carrier 2, and FIG. 2 shows a plan view. The sectional plane E1-E1 of the view in accordance with FIG. 1 is illustrated in FIG. 2. The circuit carrier 2 comprises a dielectric isolation carrier 20 having a top side 20t, to which an upper metallization layer 21 is applied, and an optional lower metallization layer 22, which is applied to an underside 20b of the dielectric isolation carrier 20 facing away from the top side 20t. If upper and lower metallization layers 21, 22 are present, they can therefore be situated on mutually opposite sides of the isolation carrier 20. The upper metallization layer 21 can be patterned as necessary, such that it has conductor tracks that can be utilized for example for electrical interconnection and/or for chip mounting. The dielectric isolation carrier 20 can be used to electrically insulate the upper metallization layer 21 and the lower metallization layer 22 from one another. At all events, the upper metallization layer 21 has at least one continuous metallization section 25. In the example shown, a plurality of such metallization sections 25 are present, which are spaced apart from one another.

The circuit carrier 2 can be a ceramic substrate, wherein the isolation carrier 20 is formed in a thin layer that comprises ceramic or consists of ceramic. Suitable materials for the upper metallization layer 21 and, if present, the lower metallization layer 22 are electrically readily conductive metals such as, for example, copper or copper alloys, aluminum or aluminum alloys, but also any other metals or alloys. If the isolation carrier 20 comprises ceramic or consists of ceramic, the ceramic can be, for example, aluminum oxide ($Al_2O_3$) or aluminum nitride (AlN) or silicon nitride ($Si_3N_4$) or zirconium oxide ($ZrO_2$), or a mixed ceramic comprising, alongside at least one of the ceramic materials mentioned, additionally at least one further ceramic material different therefrom. By way of example, a circuit carrier 2 can be formed as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate). The upper metallization layer 21 and, if present, the lower metallization layer 22 can, independently of one another, each have a thickness in the range of 0.05 mm to 2.5 mm. The thickness of the isolation carrier 20 can be e.g. in the range of 0.1 mm to 2 mm. However, thicknesses larger or smaller than those indicated are likewise possible.

As is evident from the joint consideration of FIGS. 1 and 2, each continuous metallization section 25 has an underside 25b facing the isolation carrier 20, a top side 25t facing away from the isolation carrier 20, and a side surface 25s closed in a ring-shaped fashion. The side surface 25s closed in a ring-shaped fashion laterally delimits the metallization section 25 and it extends continuously between the top side 25t and the underside. An edge 25k closed in a ring-shaped fashion is formed between the top side 25t and the side surface 25s.

In order to reduce the tendency toward voltage flashovers and partial discharges in the region of the edge 25k during later operation, a fixed dielectric coating 3 is in each case produced on the metallization section 25, which dielectric coating lies on the side surface 25s and the top side 25t and extends continuously from the side surface 25s onto the top side 25t, which is shown in cross section at the bottom in FIG. 3 and in plan view in FIG. 4. To put it another way, the dielectric coating 3 of the metallization section 25 runs around the edge 25k. FIG. 4 illustrates the course of the edges 25k concealed by the dielectric coating 3 using dashed lines. Optionally, the dielectric coating 3 can extend around the edge 25k of a metallization section 25 over the entire length thereof. Alternatively, however, it is also possible for the edge 25k not to be covered by the dielectric coating 3 in sections, for example in sections in which excessively high electric field strengths and thus voltage flashovers and partial discharges are not expected during later operation. It is likewise optionally possible for the dielectric coating 3 to completely cover the side surface 25s of a metallization section 25.

As can additionally be gathered from FIG. 4, the top side 25t of a metallization section 25 can have a continuous section 25m, which is spaced apart from the side surface 25s and is not covered by the dielectric coating 3. Optionally, a continuous section 25m can be enclosed in a ring-shaped fashion by a section 25r of the dielectric coating 3 arranged on the top side 25t.

In the region of a continuous section 25m, the relevant metallization section 25 can be uncovered and fitted in each case with one or a plurality of electronic components. As an example thereof, FIG. 3 shows two electronic components 1 provided, which are intended to be connected to a metallization section 25 in each case in the region of a continuous section 25m by means of a connecting means 4.

In principle, any desired electronic components 1 can be used. In particular, such an electronic component 1 can contain any desired active or passive element. Moreover, it is possible for one or a plurality of active electronic elements and one or a plurality of passive electronic elements to be integrated with one another in an electronic component 1. Each electronic component 1 has a first electrode 11 and at least one second electrode 12.

By way of example, an electronic component 1 can be formed as a semiconductor chip and comprise a semiconductor body 10. The electrodes 11 and 12 can then be in each case a chip metallization that is applied to the semiconductor body 10.

An optional component 1 can contain for example a diode, or a controllable semiconductor switch that can be driven via a control input (e.g. a gate or base input 13, as is shown later in FIG. 6), for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor). The first electrode 11 and the second electrode 12 of a component 1 can be for example anode and cathode, respectively, cathode and anode, respectively, source and drain, respectively, drain and source, respectively, emitter and collector, respectively, or collector and emitter, respectively, of the relevant element.

Figure 3:
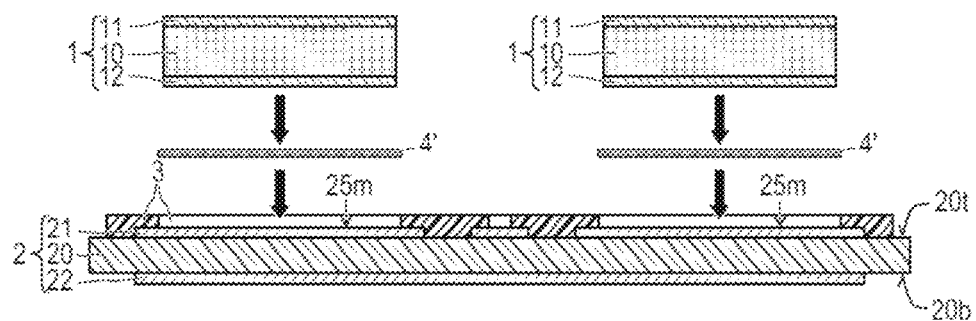
FIG. 3 shows a cross section through the circuit carrier in accordance with FIG. 1 after the process of applying a dielectric coating.
Figure 4:
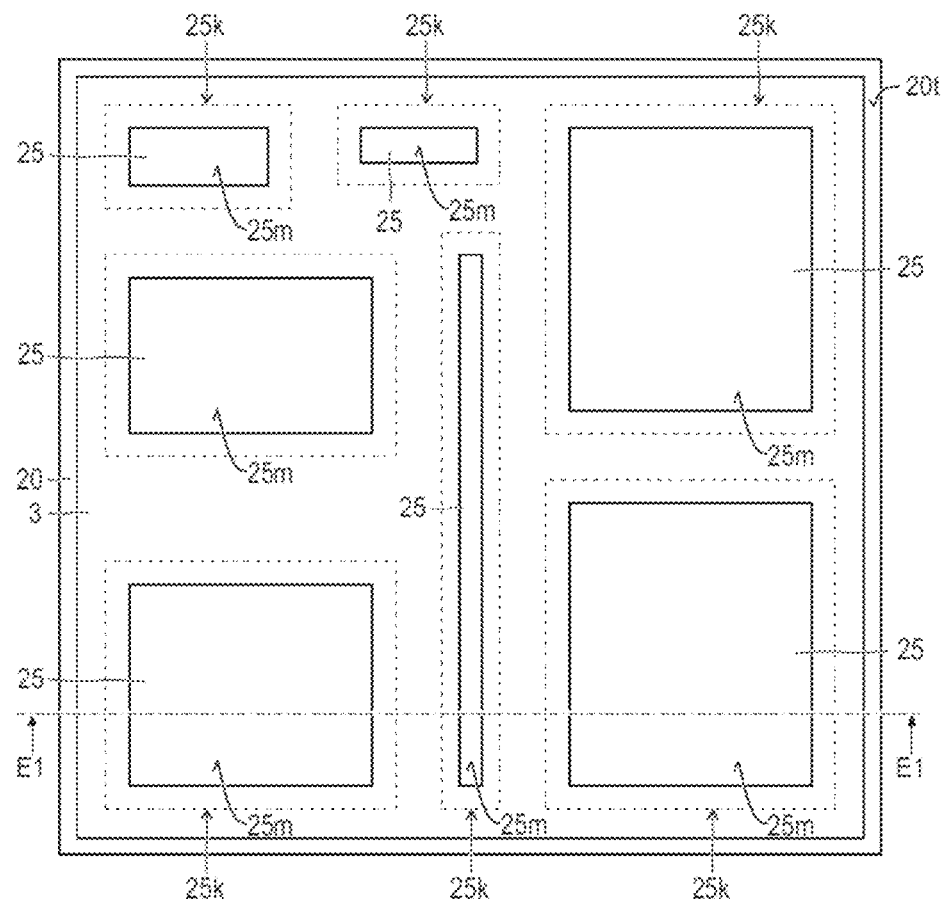
FIG. 4 shows a plan view of the circuit carrier provided with the dielectric coating in accordance with FIG. 3.

In order to mount an electrical component 1 on a continuous section 25*m*, in each case a connecting means 4' illustrated schematically in FIG. 3 is used, which is arranged between the continuous section 25*m* and the component 1 to be mounted thereon. During fitting, the connecting means 4' gives rise to a connecting layer 4 that fixedly and cohesively connects the component 1 to the continuous section 25*m*, which is shown as the result in cross section in FIG. 5 and in plan view in FIG. 6.

Optionally, an arbitrary electrode of the electrical component 1, this being the second electrode 12 in the example shown, can be electrically conductively connected to a metallization section 25 by the connecting layer 4. In this case, the connecting layer 4 is electrically conductive and additionally adjoins both the relevant electrode (here: the second electrode 12) and the continuous section 25*m* of the relevant metallization section 25.

If a solder is used as connecting means 4', the dielectric coating 3 can also be used as a solder resist. In this case, the solder 4', if it is melted during the mounting of the electrical component 1 on the continuous section 25*m*, can extend as far as the dielectric coating 3 in the liquid state and later also in the solidified state. Accordingly, in the case of the finished semiconductor arrangement, too, a solid connecting layer 4 formed as a solder layer can extend as far as the dielectric coating 3.

Figure 6:
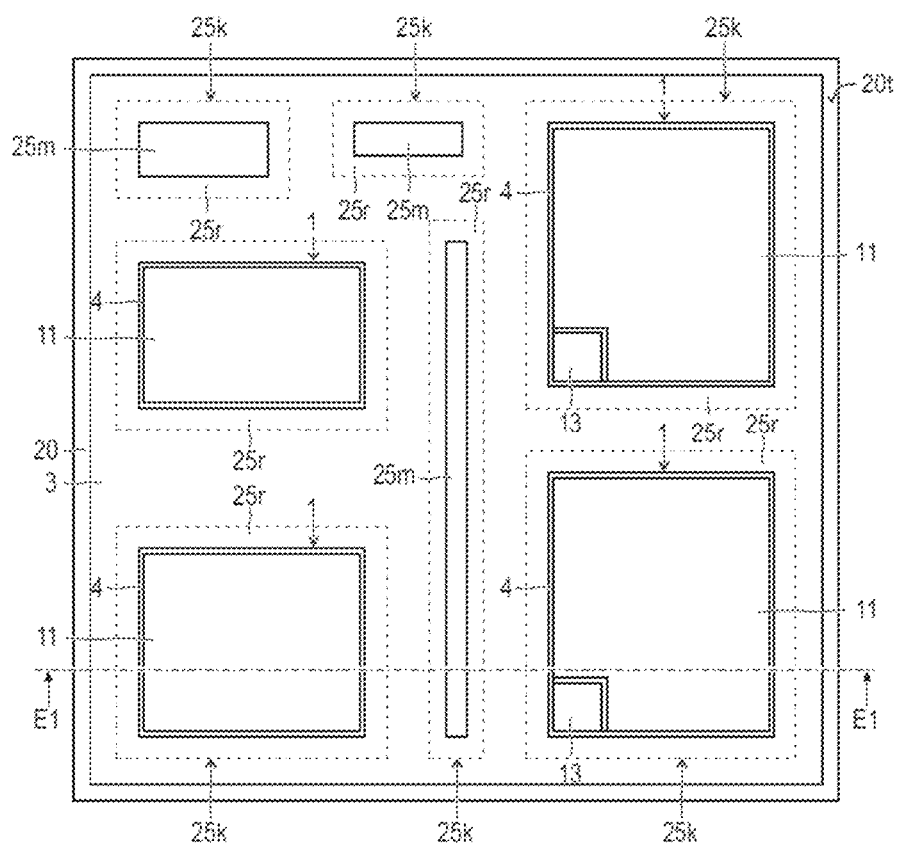
FIG. 6 shows a plan view of the circuit carrier in accordance with FIG. 5 provided with the dielectric coating and fitted with a semiconductor chip.

As can be gathered from the plan view in accordance with FIG. 6, a component 1 containing a controllable element, for example a controllable semiconductor switch, can have a control electrode 13. As can likewise be gathered from FIG. 6, the upper metallization layer 21 of a circuit carrier 2 can also have metallizations 25, the edges 25*k* of which are covered as explained—completely or in sections—by the dielectric coating 3, without the relevant metallization 25 or a continuous section 25*m* of said metallization 25 being fitted with an active or passive electronic component. Such a metallization 25 can be used as a conductor track for example, to which an electrical conductor is connected by wire bonding, soldering, welding, adhesively bonding or sintering.

In this context, an electrical conductor is not understood as an "electrical element".

An explanation is given below, on the basis of various examples, of how a circuit carrier 2 can be provided with a dielectric coating 3, in particular with a dielectric coating 3 having the structural properties explained above. At all events, the dielectric coating 3 is produced by a dielectric material being applied at least partly to a metallization section 25 and being cohesively and fixedly connected thereto in the process.

One variant provides for a preliminary product 3" of the dielectric coating 3, for example a paste, to be applied to the circuit carrier 2 using a stencil 9 or a screen. The stencil 9 or the screen is configured such that it has one or a plurality of openings above the edges 25*k* that are intended to be protected by a dielectric coating 3, such that the preliminary product 3" applied to the circuit carrier 2 through the openings covers the edge 25*k*. By contrast, continuous sections 25*m* which are intended later to be fitted with an electrical component 1 and/or contacted by an electrical conductor can be covered by the stencil 9 or the screen, such that no application of the preliminary product 3" on the circuit carrier 2 takes place on the sections 25*m*. The applied preliminary product 3" can then be cured and—beforehand or afterward—the stencil 9 or the screen can be removed. As a result, the preliminary product 3" forms the dielectric coating 3 after curing.

Through the use of a stencil 9 or a screen, the dielectric coating 3 is produced by a dielectric material, that is to say the preliminary product 3", being applied to the metallization section 25 and being cohesively connected thereto in the process. In this case, the process of application can be carried out in such a way that the continuous section 25*m*, during the process of applying the dielectric material, is not covered with a material that is identical to the dielectric material of the preliminary product 3".

Figure 7:
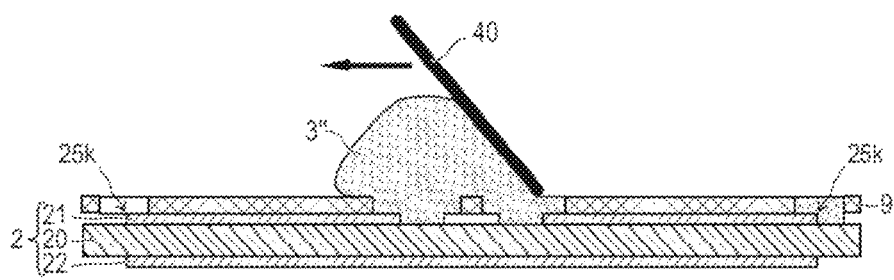
FIG. 7 shows a step during a first method for producing a circuit carrier provided with a dielectric coating.

As is shown in FIG. 7, the preliminary product 3" can be a paste that is drawn over the stencil 9 or the screen by means of a blade 40 and in the process is pressed into the openings of the stencil 9 or screen (stencil or screen printing).

In principle, however, a preliminary product 3" can also be applied by any other methods, for example by means of physical vapor deposition (PVD), by means of chemical vapor deposition (CVD), by means of spraying, by rotary coating ("spin coating" or "spin-on"), or by means of dipping.

Instead of being applied as a paste, a preliminary product 3" can also be applied as a liquid to the circuit carrier 2 or be deposited thereon from the gas phase. It is likewise possible to use a stamped film as preliminary product 3", said stamped film then being placed onto the circuit carrier 2 and softened thermally, for example, such that it settles on the metallization section 25 around the edge 25*k* and, after subsequent cooling, solidifies and is fixedly and cohesively connected to the metallization section 25 in the process.

A further variant provides for the dielectric coating 3 to be produced by a dielectric material firstly being applied as a closed layer 3' to the metallization section 25 and being cohesively connected thereto in the process. In this case, the metallization section 25 can be completely covered by the closed layer 3'. Afterward, the closed layer 3' is opened in the region of the continuous section 25*m*, such that the continuous section 25*m* is uncovered. The then uncovered continuous section 25*m* can optionally be fitted with one or a plurality of electrical components 1 and/or be electrically connected by means of an electrical conductor.

Figure 8:
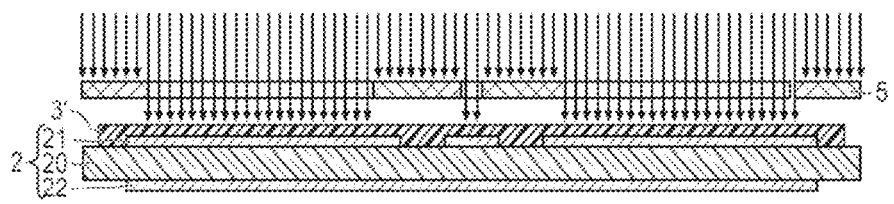
FIG. 8 shows a step during a second method for producing a circuit carrier provided with a dielectric coating.
Figure 9:
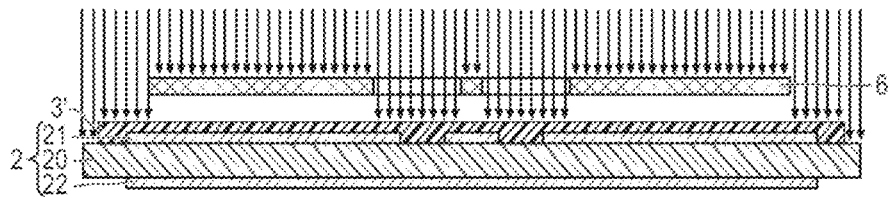
FIG. 9 shows a step during a third method for producing a circuit carrier provided with a dielectric coating.

In the examples in accordance with FIGS. 8 and 9, the closed layer 3' is formed as a photosensitive layer and can thus be patterned photolithographically. The light used for exposure here is schematically illustrated in each case by a multiplicity of arrows.

In the example in accordance with FIG. 8, the closed layer 3' is formed as a photopositive layer, wherein the closed layer 3' already solidified after application to the circuit carrier 2 is selectively exposed and is removed and thus opened in the exposed region by means of a developer, while the unexposed residues of the closed layer 3' remain on the circuit carrier 2. The unexposed residues can then form the dielectric coating 3, or the dielectric coating 3 is produced from the unexposed residues. By way of example, conventional photopositive resists such as are used in electronic fabrication technology, for example in the production of printed circuit boards or semiconductor elements, are suitable as suitable material for a photopositive layer.

In the example in accordance with FIG. 9, the closed layer 3' is formed as a photonegative layer, which is selectively exposed after application to the circuit carrier 2. In this case, the material of the closed layer 3' polymerizes in the exposed regions and is fixedly connected to the circuit carrier 2.

During subsequent development, the unexposed residues of the closed layer 3' are removed and the closed layer 3' is opened as a result. The polymerized material can then form the dielectric coating 3, or the dielectric coating 3 is produced from the polymerized material. By way of example, conventional photonegative resists such as are used in electronic fabrication technology, for example in the production of printed circuit boards or semiconductor elements, are suitable as suitable material for a photonegative layer.

The selective exposure can be carried out in any desired manner, for example using a suitably patterned mask 5 (FIG. 8) or 6 (FIG. 9). Since the closed layer 3' in the example in accordance with FIG. 8 is photopositive and its exposed parts are removed later, the mask 5 is likewise opened above the later continuous sections 25m, that is to say above the regions to be opened. By contrast, the mask 6 in accordance with FIG. 9 is closed above the later continuous sections 25m, that is to say above the regions to be opened, since the closed layer 3' in the example in accordance with FIG. 9 is photonegative and its unexposed parts are removed later.

The masks 5 and 6, respectively, can be spaced apart from the circuit carrier 2 and the closed layer 3', as illustrated, but can alternatively also bear thereon or be projected by means of an optical unit.

As a result, a circuit carrier 2 provided with a dielectric coating 3 is in each case present, as was explained with reference to the previous figures or was subsequently fitted.

Figure 10:
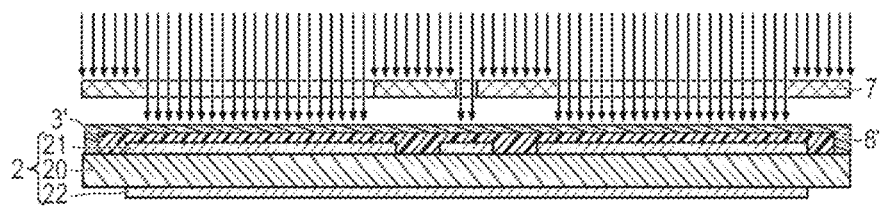
FIGS. 10 to 12 show different steps during another, fourth method for producing a circuit carrier provided with a dielectric coating.
Figure 11:
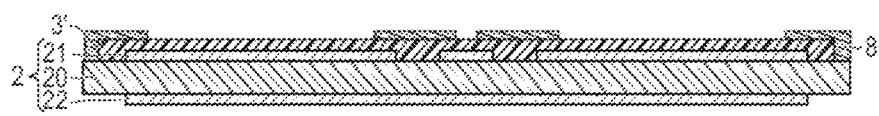
Figure 12:
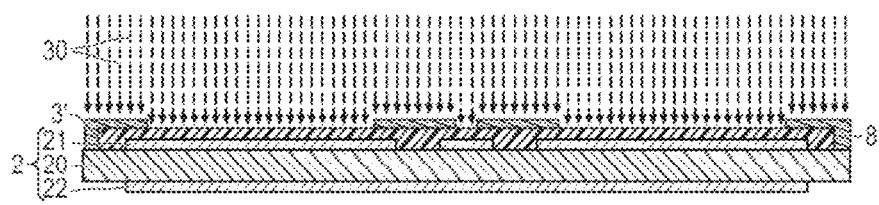

In accordance with a further example, explained with reference to FIGS. 10 to 12, a patterned etching mask 8 can also be produced on the closed layer 3'. For this purpose, a photoresist layer 8' is applied to the side of the closed layer 3' facing away from the circuit carrier 2 and is selectively exposed, for example by means of a patterned mask 7. The photoresist layer 8' can be—as illustrated—photopositive, alternatively also photonegative. Suitable materials for producing the photoresist layer 8' are once again the photonegative resists or photopositive resists already mentioned.

At all events, the mask 7 is patterned in such a way that the photoresist layer 8' is opened after exposure and subsequent development above the sections of the closed layer 3' that are to be opened, that is to say above the later continuous sections 25m. FIG. 11 shows the arrangement with the opened photoresist layer 8' that forms the photomask 8.

The closed layer 3' can then be opened above the later continuous sections 25m by means of an etching process, in which the opened photomask 8 is used as an etching mask. Suitable etching methods include, in principle, both isotropic and anisotropic etching methods, to be precise wet-etching methods and likewise dry-etching methods. Unlike in the case of isotropic etching methods, with anisotropic etching methods it is possible largely to avoid undercuts in the edge region of the etching mask.

Optionally, the etchant 30 used can be chosen such that the etching of the closed layer 3' is carried out selectively with respect to the upper metallization layer 21 and optionally also selectively with respect to the lower metallization layer 22. This is the case if the etchant 30 indeed attacks the closed layer 3', but does not attack, or at least does not significantly attack, the upper metallization layer 21 and (if present) the lower metallization layer 22. If the etching is not carried out selectively and a lower metallization layer 22 is present, it can be expedient to provide the latter with a protective coating and thus to protect it from damage resulting from the etchant 30.

Figure 13:
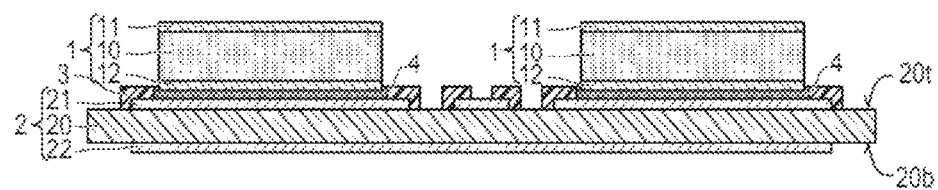
FIG. 13 shows a cross section through a circuit carrier provided with a dielectric coating and fitted with a semiconductor chip.
Figure 14:
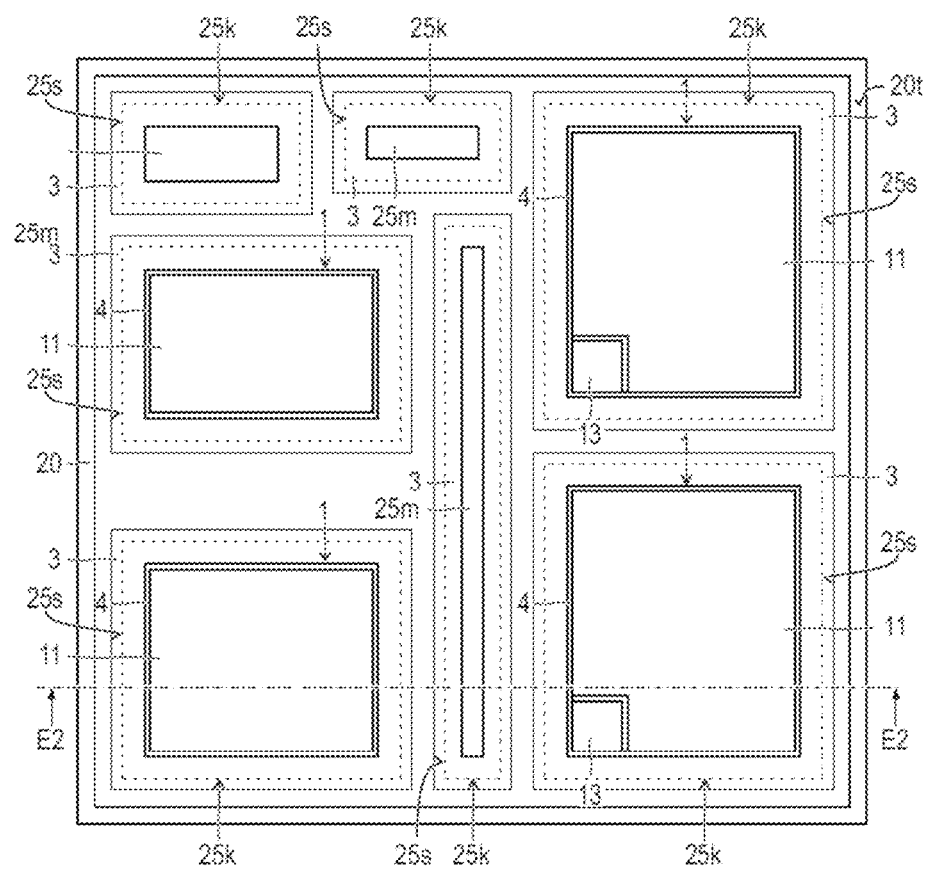
FIG. 14 shows a plan view of the circuit carrier in accordance with FIG. 13 provided with the dielectric coating and fitted with a semiconductor chip.

While the dielectric coating 3 was formed as a continuous patterned layer in the previous examples, FIG. 13 shows in cross section and FIG. 14 in plan view that a dielectric coating 3 can also have two or more sections spaced apart from one another. FIG. 13 shows a sectional view through the sectional plane E2-E2 illustrated in FIG. 14. As can readily be discerned in FIG. 14, in particular, the individual sections of the dielectric coating 3 are in each case formed as a closed ring that completely covers an edge 25k—closed in a ring-shaped fashion—of exactly one of the metallization sections 25, and optionally also the side surface 25s of the relevant metallization section 25.

In a departure from the exemplary embodiments shown, the dielectric coating 3 can also extend as far as the lateral edge of the isolation carrier 20 or the top side 20t thereof.

As shown above, during the process of applying the dielectric coating 3 to the circuit carrier 2, it is possible for a metallization section 25 to remain completely with nothing fitted thereto, in particular not to be fitted with an electronic component. Optionally, however, after the dielectric coating 3 has been produced, said metallization section can be fitted with one or a plurality of electrical components 1 in its continuous section 25m, as explained.

Independently of the method for producing it, the completed dielectric coating 3 can, in principle, consist of an arbitrary dielectric material or comprise an arbitrary dielectric material (insofar as the relevant production method does not exclude specific materials). The dielectric material can be organic or inorganic. Suitable organic dielectric materials are, for example, polyimides, epoxides, parylenes, benzocyclobutenes (BCBs), aromatic polyethers, polyaryls, fluoropolymers, etc. Suitable inorganic dielectric materials are, for example, ceramics, non-ceramics, amorphous silicon dioxide, amorphous carbon (DLC=Diamond-Like Carbon), etc. Likewise, the dielectric material can be a hybrid comprising an organic material and an inorganic material, for example a silicone, e.g. a spin-on silicone.

Figure 15:
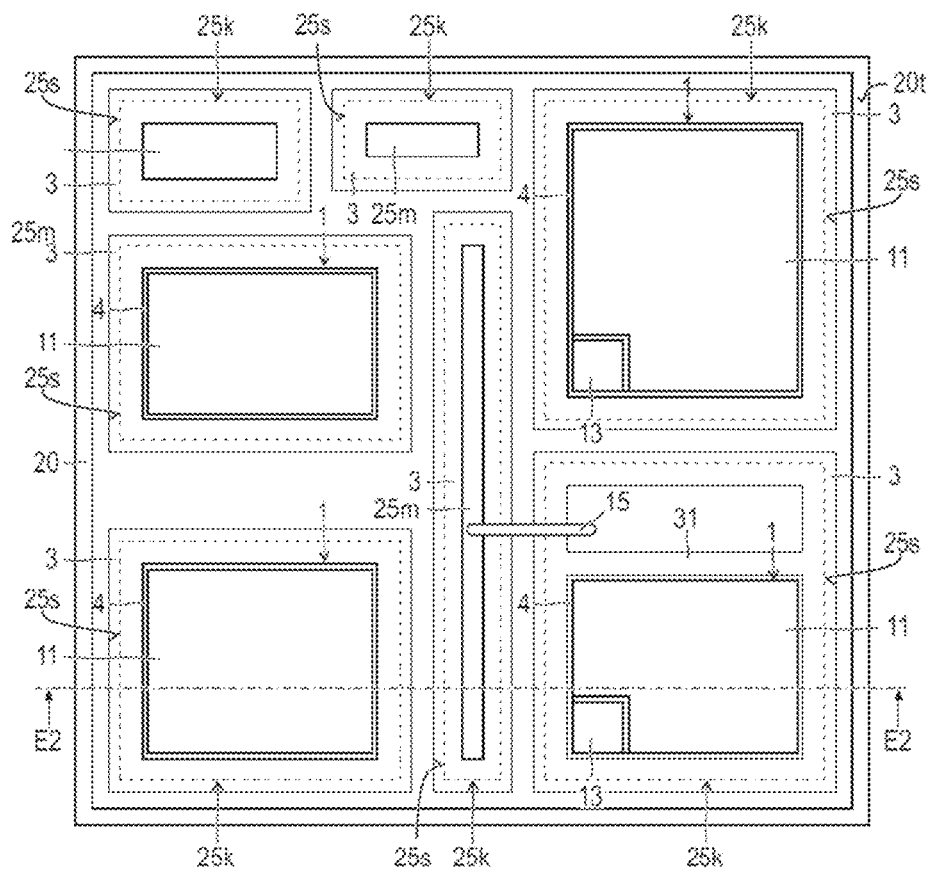
FIG. 15 shows a plan view of a circuit carrier provided with a dielectric coating and fitted with a semiconductor chip, wherein the dielectric coating has a web that subdivides a continuous surface section of a metallization section.

In accordance with a further option illustrated in FIG. 15, a section 31 of a dielectric coating 3 can also be utilized for subdividing an continuous section 25m of a top side 25t of a metallization section 25 into partial sections, for example in order to prevent a solder that is used for mounting an electrical component 1 on one of the partial sections from running into the other partial section. This can be expedient, for example, if an electrically conductive connecting element 15, for example a bonding wire, is intended to be connected, for example wire-bonded, to the other partial section in a later method step. Alternatively or additionally, such a section 31 can also be utilized for preventing torsion or excessively great torsion relative to the circuit carrier 2 during the mounting of an electrical component on one of the partial sections (e.g. by soldering).

Figure 16:
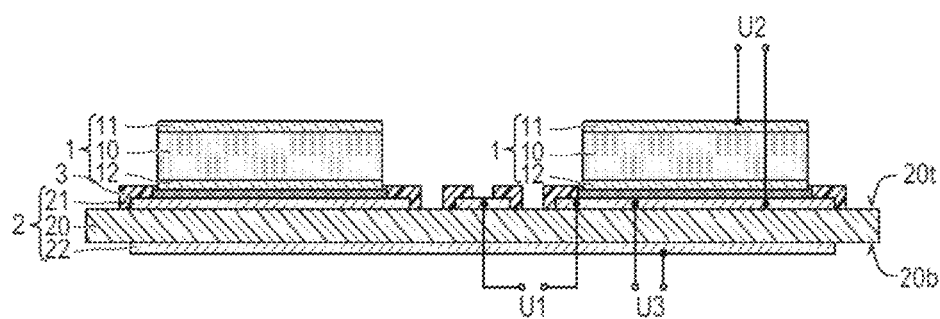
FIG. 16 shows a circuit carrier provided with a dielectric coating and fitted with a semiconductor chip with voltage applied.

As can furthermore be gathered from FIG. 16, which shows a sectional view through the sectional plane E3-E3 in accordance with FIG. 15, during the operation of a circuit arrangement comprising a circuit carrier 2 provided with a dielectric coating, an electrical voltage U1 can be applied for example between two metallization sections 25 of the upper metallization layer 21, in particular also between two adjacent metallization sections 25 of the upper metallization layer 21. Correspondingly, if a lower metallization layer 22 is present, an electrical voltage U3 can be applied between a metallization section 25 and the lower metallization layer 22. In this case, the lower metallization layer 22 can optionally be at ground potential. Moreover, if the circuit carrier 2 is fitted with an active or passive component 1, as explained, an electrical voltage U2 can be applied between the first electrode 11 and the second electrode 12 of the electrical component 1. If the electrical component 1 is mounted on a metallization section 25 and is electrically conductively connected thereto at its second electrode 12, the electrical voltage U2, for example at least 10 V or at least 300 V or even at least 3 kV, is also present between the first electrode 11 and the relevant metallization section 25. The voltages U1 and U3 can be chosen in any desired manner, in principle. They can be, independently of one another, at least 300 V or even at least 3 kV, for example.

Figure 5:
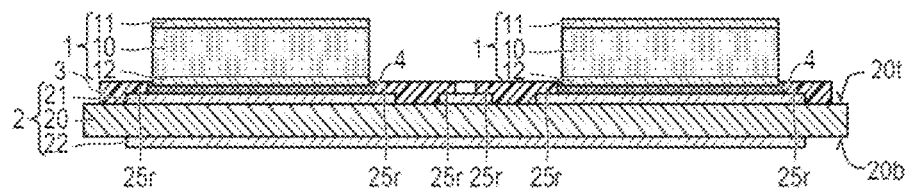
FIG. 5 shows a cross section through the circuit carrier in accordance with FIG. 3 provided with the dielectric coating and fitted with a semiconductor chip.
Figure 17:
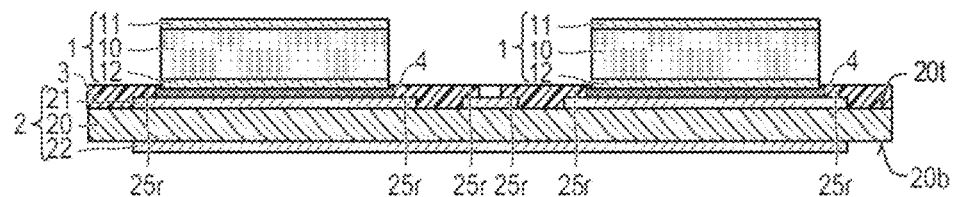
FIG. 17 shows a cross section through a carrier circuit formed in accordance with FIG. 5, wherein the dielectric coating extends as far as the lateral edge of the isolation carrier.
Figure 18:
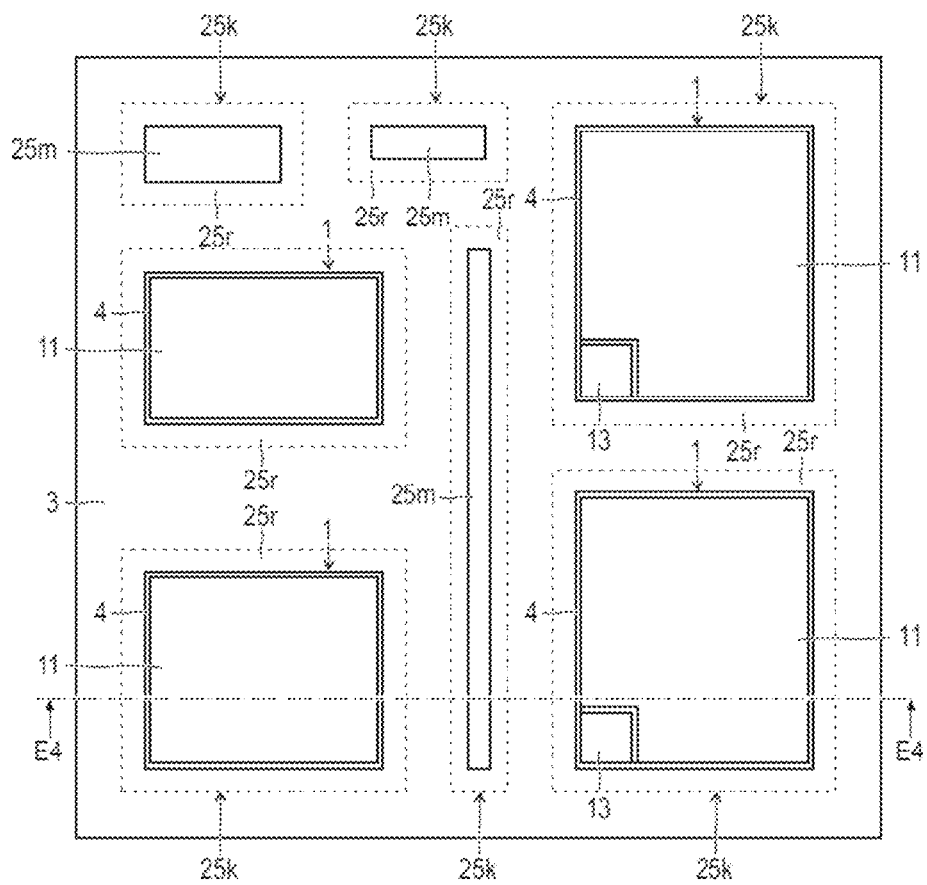
FIG. 18 shows a plan view of the circuit carrier in accordance with FIG. 17 provided with the dielectric coating and fitted with a semiconductor chip.

As is furthermore shown in FIG. 17 on the basis of a modified configuration of the arrangement in accordance with FIG. 5, the dielectric coating 3 can also extend as far as the lateral edge of the isolation carrier 20, i.e. as far as the lateral edge of that side of the isolation carrier 20 which faces the upper metallization layer 21. FIG. 18 shows a plan view of the fitted circuit carrier 2 in accordance with FIG. 17. FIG. 18 likewise illustrates the sectional plane E4-E4 of the sectional view in accordance with FIG. 17.

Figure 19:
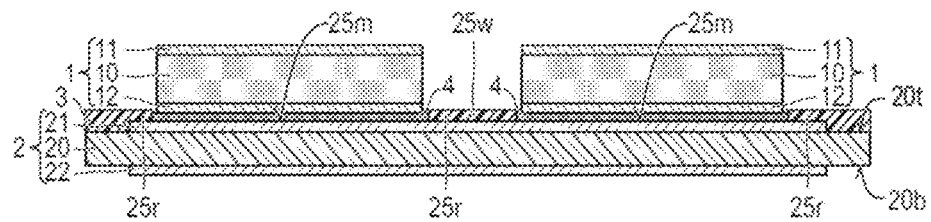
FIG. 19 shows a cross section through a fitted circuit carrier provided with a dielectric coating, wherein the dielectric coating has a web that bears on a metallization section and on the latter separates two contact pads of the metallization section.
Figure 20:
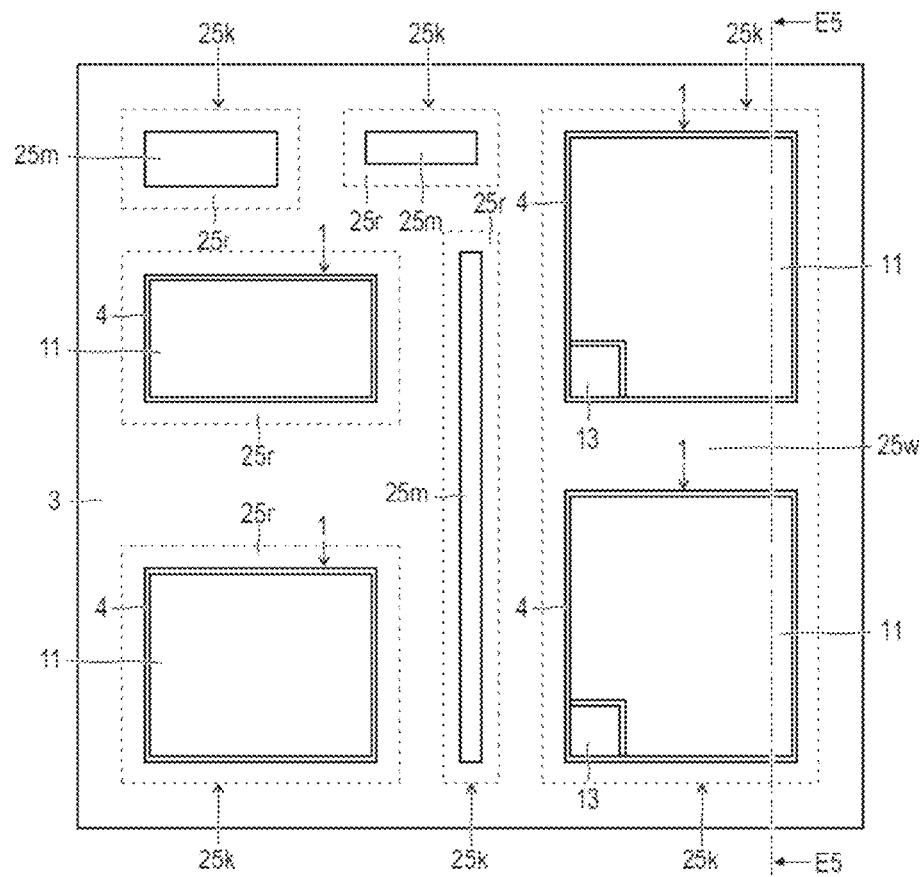
FIG. 20 shows a plan view of the circuit carrier in accordance with FIG. 19.

In accordance with an optional configuration illustrated in FIG. 19, a dielectric coating 3 can also have a web 25w, which separates a first and a second respectively continuous section 25m of the top side 25t of the same metallization section 25 from one another. Such a web, like a dielectric coating 3 in general, can be used as a solder resist by preventing the flowing-out of liquid solder 4 situated on the first and/or the second respectively continuous section 25m of the top side 25t of the same metallization section 25. Accordingly, the solder 4 in the liquid state, but also after its solidification, can extend as far as the web 25w. FIG. 20 shows a plan view of the circuit carrier in accordance with FIG. 19.

An arbitrary circuit carrier 2 provided with a dielectric coating 3, which circuit carrier can optionally be fitted with one or a plurality of electronic elements, in particular also semiconductor elements, in particular therefore also each of the semiconductor arrangements described herein, can be used for producing a semiconductor module 100 comprising an integral or multipart module housing 6, and electrical external connections 72.

Figure 21:
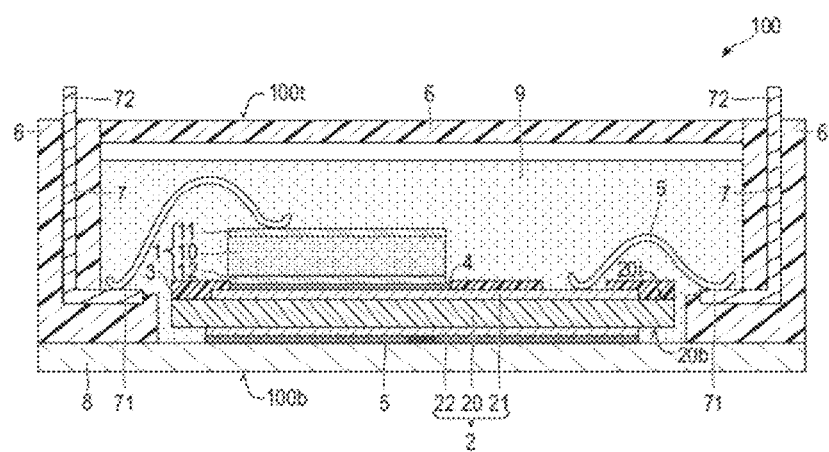
FIG. 21 shows a cross section through a semiconductor module in which a fitted circuit carrier is incorporated.

FIG. 21 shows another example of such a semiconductor module 100. In this case, the electronic element or elements is/are arranged in the interior of the module housing 6.

In order to produce the semiconductor module 100, the circuit carrier 2 provided with the dielectric coating 3 and fitted with at least one semiconductor element 1 is fixedly connected to the housing 6.

In the present example, for this purpose the circuit carrier 2 is cohesively connected to a baseplate 8 at its lower metallization layer 22 by means of a planer connecting layer 5. In this case, the connection layer 5 adjoins both the circuit carrier 2 (here: the lower metallization layer 22 thereof) and the baseplate 8. The connecting layer 5 can be for example a sintered layer, a solder layer, or an adhesive layer, wherein the latter can be electrically insulating or electrically conductive. The baseplate 8 can be for example a metal plate composed of or comprising a material having good thermal conductivity, such as copper or aluminum, for example. The baseplate 8 can likewise consist of a metal matrix composite (MMC) material. Moreover, the baseplate 8 can optionally have a thin, for example electrolytically produced, surface coating (e.g. composed of nickel), in order to prevent oxidation and to improve solderability. The fixed connection between the fitted circuit carrier 2 and the housing 6 is effected indirectly via the baseplate 8, for example by the baseplate 8 being screwed and/or adhesively bonded to the side walls 6s of the housing 6. The connection process can be carried out in such a way that the side walls 6s of the housing 6 together with the baseplate 8 form an impermeable trough. That side of the baseplate 8 which faces away from the circuit carrier 2 then forms the uncovered underside 100b of the semiconductor module 100.

In accordance with an alternative configuration, a baseplate 8 and in association therewith the connecting layer 5 are also dispensable. In this case, the circuit carrier 2 provided with the dielectric coating 3 and fitted with at least one semiconductor element 1 can also be directly fixedly connected to the side walls 6s of the housing 6, for example by adhesive bonding by means of an adhesive. In this case, the adhesive adjoins both the side walls 6s and the circuit carrier 2. The connection process can be carried out in such a way that the side walls 6s together with the circuit carrier 2 form an impermeable trough. That side of the lower metallization layer 22 which faces away from the isolation carrier 20 then forms the uncovered underside 100b of the semiconductor module 100.

Independently of whether or not the semiconductor module 100 comprises a baseplate 8 and a connecting layer 5, it can be brought into thermal contact with a heat sink at its underside 100b. Between the underside 100b and the heat sink, a thermal interface material (TIM), e.g. a thermally conductive paste or a thermally conductive film, can optionally also be introduced, which contacts both the underside 100b of the semiconductor module 100 and the heat sink.

The semiconductor module 100 furthermore comprises electrical external connections 72 that can be arranged at a top side 100t facing away from the underside 100b of the semiconductor module 100. The external connections 72 can be, for example, parts of an electrical connection conductor 7 which, as illustrated, is injection-molded into the housing 6 or which is inserted into the housing 6 after the production thereof, for which purpose the housing 6 can have corresponding guides. The connection conductors 7 injection-molded into the housing 6 or inserted into the latter can then be electrically conductively connected to the circuit realized on the circuit carrier 2 at sections 71 uncovered in the interior of the housing 6 by means of any desired connecting techniques (e.g. wire bonding, soldering, welding, electrically conductive adhesive bonding) and at any desired locations. In the case of the semiconductor module 100 in accordance with FIG. 21, bonding wires are used merely by way of example. The uncovered sections 71 need not bear on the housing 6, as illustrated, rather they could for example also extend right over a metallization section 25 and be directly welded, soldered or electrically conductively adhesively bonded thereto there.

However, a connection conductor 7 need not necessarily firstly be injection-molded into the housing 6 or be inserted into the latter and then be electrically conductively connected to the circuit. In this regard, there is also the possibility of electrically conductively and mechanically connecting a connection conductor 7, at an uncovered section 71, to the circuit carrier 2 provided with the coating 3 and/or to an electrical element 1 incorporated thereon, and then of adhesively bonding the assemblage with the housing 6, such that the uncovered section 71 is arranged in the interior of the housing 6. This variant can be realized both in the case of semiconductor modules 100 comprising baseplate 8 and connecting layer 5 and in the case of semiconductor modules 100 without baseplate 8 and connecting layer 5. The electrically conductive and mechanical connection between the connection conductor 7 and the circuit carrier 2 provided with the coating 3 and/or an electrical element 1 incorporated thereon can be carried out, for example, by the connection conductor 7 being soldered, welded or electrically conductively adhesively bonded, at the uncovered section 71, to the circuit carrier 2 and/or to an electrical element 1 incorporated thereon, or being inserted into a sleeve that is soldered, welded or electrically conductively adhesively bonded to the circuit carrier 2 and/or to an electrical element 1 incorporated thereon. Free ends 72 of the connection conductor 7 can then be led through a cover 6c of the housing 6, such that they are uncovered at the top side 100t of the semiconductor module 100 formed by the cover 6c and can be utilized as external connections 72 of the semiconductor module 100.

The cover 6c of the housing 6 can be formed either integrally with the side walls 6s thereof or else separately therefrom and can be connected to the side walls 6s only after the connection of the fitted circuit carrier 2 to the side walls 6s, whether directly or indirectly via a baseplate 8 and a connecting layer 5.

In order to electrically isolate the semiconductor module 100 even more extensively, a dielectric potting compound 9 can be filled into the interior of the module housing 6. In this case, the impermeable trough formed by the side walls 6s and the baseplate 8 or by the side walls 6s and the circuit carrier 2 prevents the potting compound 9 from running out at least during the filling process. The potting compound 9 can be cured after filling at least until a state that is no longer flowable is attained, or alternatively it can be crosslinked only to an extent such that it forms a gel, which is still present as a gel also in the completed semiconductor module 100, in particular also during electrical operation.

The process of filling the potting compound 9 into the trough can be carried out with the cover 6c removed, provided that the latter is present as an element separate from the side walls 6s. Alternatively, there is also the possibility of filling the potting compound 9 into the trough through a filling opening formed in the cover 6c. In this case, the cover 6c can be formed integrally with the side walls 6s or alternatively be present as an element separate from the side walls 6s. Insofar as filling is carried out through a filling opening, the latter can optionally be closed after filling.

The potting compound 9 introduced by filling serves to avoid or reduce electrical flashovers and creepage currents in the interior of the housing 6. The potting compound 9 extends as far as the circuit carrier 2, in particular as far as the dielectric coating 3 thereof. The dielectric coating 3 can optionally have a breakdown field strength that is greater than the breakdown field strength of the potting compound 9. As a result, the dielectric coating 3 brings about an improvement of the isolation of the circuit carrier 2 in comparison with a conventional semiconductor module without a coating 3. Alternatively or additionally, the dielectric coating 3 can have a relative permittivity that is greater than the breakdown field strength of the potting compound 9. By way of example, the dielectric coating 3 can have a relative permittivity $\epsilon_r$ of at least 2.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit carrier, comprising:
    a dielectric isolation carrier;
    an upper metallization layer applied to the dielectric isolation carrier and having a metallization section, the metallization section having an underside facing the isolation carrier, a top side facing away from the isolation carrier, and a side surface closed in a ring-shaped fashion, the side surface laterally delimiting the metallization section and extending continuously between the top side and the underside;
    a dielectric coating which bears on the side surface and the top side, and extends continuously from the side surface onto the top side.

2. A method for producing a circuit carrier, the method comprising:
    providing a dielectric isolation carrier including an upper metallization layer, the upper metallization layer having a metallization section, the metallization section having an underside facing the isolation carrier, a top side facing away from the isolation carrier, and a side surface closed in a ring-shaped fashion, the side surface laterally delimiting the metallization section and extending continuously between the top side and the underside; and
    producing a dielectric coating which bears on the side surface and the top side, and extends continuously from the side surface onto the top side.

3. The method of claim 2, wherein the metallization section has an edge formed between the top side and the side surface and closed in a ring-shaped fashion, wherein the dielectric coating extends around the edge over its entire length.

4. The method of claim 2, wherein the dielectric coating completely covers the side surface.

5. The method of claim 2, wherein the dielectric coating has an uninterrupted section that bears in each case directly on the isolation carrier, the side surface and the top side.

6. The method of claim 2, wherein the isolation carrier is formed as a ceramic layer.

7. The method of claim 2, wherein the dielectric coating directly adjoins the metallization section and is cohesively connected thereto and/or directly adjoins the isolation carrier and is cohesively connected thereto.

8. The method of claim 2, wherein the metallization section is not fitted with an electronic component when the dielectric coating is produced.

9. The method of claim 2, wherein the top side has a first continuous section which is spaced apart from the side surface and not covered by the dielectric coating.

10. The method of claim 9, wherein the top side has a second continuous section which is spaced apart from the first continuous section and separated from the first continuous section by a web formed in the dielectric coating, the web bearing directly on the top side.

11. The method of claim 9, wherein the dielectric coating is produced by a dielectric material being applied at least to the metallization section and being cohesively connected thereto in the process, wherein the continuous section, during the process of applying the dielectric material, is not covered with a material that is identical to the dielectric material.

12. The method of claim 11, wherein the dielectric material is applied using a patterned mask which prevents the dielectric material from being applied to the continuous section.

13. The method of claim 9, wherein the dielectric coating is produced by a dielectric material being applied as a closed layer to the metallization section and being cohesively connected thereto in the process, and wherein the closed layer is opened such that the continuous section is uncovered.

14. The method of claim 13, wherein the closed layer is opened by:
   photopatterning by the closed layer being formed as a photopositive or photonegative light-sensitive layer which is selectively exposed and then opened in the region of the continuous section, while the dielectric coating is formed from a remaining part of the closed layer; or
   by a patterned mask being produced on the closed layer and the closed layer being patterned using the patterned mask in such a way that the closed layer is opened in the region of the continuous section, while the dielectric coating is formed from a remaining part of the closed layer.

15. A method for producing a semiconductor arrangement, the method comprising:
   providing a semiconductor component having a first electrode and a second electrode;
   providing a circuit carrier comprising a dielectric isolation carrier, an upper metallization layer applied to the dielectric isolation carrier and having a metallization section, the metallization section having an underside facing the isolation carrier, a top side facing away from the isolation carrier, and a side surface closed in a ring-shaped fashion, the side surface laterally delimiting the metallization section and extending continuously between the top side and the underside, and a dielectric coating which bears on the side surface and the top side, and extends continuously from the side surface onto the top side; and
   fitting the continuous section with the semiconductor component by the semiconductor component being cohesively connected to the continuous section at the second electrode by a connecting layer.

16. The method of claim 15, wherein the connecting layer is produced from a solder.

17. The method of claim 16, wherein the solder is melted during the fitting process and the dielectric coating is used as a solder resist mask for the melted solder.

18. A method for operating a circuit arrangement, the method comprising:
   producing a circuit arrangement comprising a semiconductor component having a first electrode and a second electrode, and a circuit carrier comprising a dielectric isolation carrier, an upper metallization layer applied to the dielectric isolation carrier and having a metallization section, the metallization section having an underside facing the isolation carrier, a top side facing away from the isolation carrier, and a side surface closed in a ring-shaped fashion, the side surface laterally delimiting the metallization section and extending continuously between the top side and the underside, and a dielectric coating which bears on the side surface and the top side, and extends continuously from the side surface onto the top side, wherein the continuous section is fitted with the semiconductor component, the semiconductor component being cohesively connected to the continuous section at the second electrode by a connecting layer;
   applying a first electrical voltage of at least 300 V between the metallization section and a further metallization section of the first metallization layer; and/or
   applying a second electrical voltage of at least 10 V between the first electrode and the second electrode.

19. The method of claim 18, wherein the circuit carrier comprises a lower metallization layer arranged on a side of the isolation carrier which faces away from the upper metallization layer, the method further comprising:
   applying a third electrical voltage of at least 300 V between the metallization section and the lower metallization layer.

20. A method for producing a semiconductor module, the method comprising:
   producing a semiconductor arrangement comprising a semiconductor component having a first electrode and a second electrode, and a circuit carrier comprising a dielectric isolation carrier, an upper metallization layer applied to the dielectric isolation carrier and having a metallization section, the metallization section having an underside facing the isolation carrier, a top side facing away from the isolation carrier, and a side surface closed in a ring-shaped fashion, the side surface laterally delimiting the metallization section and extending continuously between the top side and the underside, and a dielectric coating which bears on the side surface and the top side, and extends continuously from the side surface onto the top side, wherein the continuous section is fitted with the semiconductor component, the semiconductor component being cohesively connected to the continuous section at the second electrode by a connecting layer;
   providing a module housing;
   connecting the semiconductor arrangement to the module housing; and
   subsequently filling a dielectric potting compound, which has a smaller relative permittivity and/or a lower breakdown field strength than the dielectric coating, into the module housing such that the dielectric potting compound contacts the dielectric coating.

* * * * *